United States Patent [19]
Sakurada et al.

[11] Patent Number: 5,028,795
[45] Date of Patent: Jul. 2, 1991

[54] ION IMPLANTATION APPARATUS

[75] Inventors: Yuzo Sakurada, Kanagawa; Osamu Tsukakoshi, Hiratsuka, both of Japan

[73] Assignee: Nihon Shinku Gijutsu Kabushiki Kaisha, Chigasaki, Japan

[21] Appl. No.: 496,348

[22] Filed: Mar. 20, 1990

[30] Foreign Application Priority Data

Mar. 22, 1989 [JP] Japan .................................. 1-69915

[51] Int. Cl.$^5$ .......................................... H01V 37/317
[52] U.S. Cl. .................................. 250/492.2; 250/398
[58] Field of Search ............... 250/492.2, 492.21, 398, 250/492.3

[56] References Cited

U.S. PATENT DOCUMENTS

4,142,132 2/1979 Harte ................................ 250/492.2
4,710,639 12/1987 Sawaragi ........................... 250/398
4,936,968 6/1990 Ohnishi et al. ................. 250/492.21

Primary Examiner—Jack I. Berman
Attorney, Agent, or Firm—Brady, O'Boyle & Gates

[57] ABSTRACT

An ion implanation apparatus comprises a first multipole electrostatic deflector and a second multipole electrostatic deflector. The first multipole electrostatic deflector comprises five or more electrodes equally spaced around an optical axis to each of which voltage for offset-deflecting the ion beam at the predetermined angle and voltage for simultaneously sweeping the ion beam in X and Y directions are applied. The second multipole electrostatic deflector is disposed around a second optical axis starting from the center of the first deflector and directed towards a line which makes the predetermined angle with the axis of the first deflector, and comprises the same number of electrodes as the first deflector equally spaced around the second optical axis, to each of which voltage for sweeping the ion beam in X and Y directions are applied so that the ion beam is implanted on the target(s) at a constant angle therewith while keeping the direction of incidence of the ion beam parallel with the second optical axis.

6 Claims, 8 Drawing Sheets

ION IMPLANTATION APPARATUS

FIELD OF THE INVENTION

The present invention relates to an ion implantation apparatus intended for raster-scanning ion beams on a substrate to be ion implanted.

BACKGROUND OF THE INVENTION

As wellknown an ion implantation is utilized to perform an impurity doping or a material synthesization on a substrate by irradiating accelerated ions onto the surface thereof. The doping can be performed without any influence of the surface condition of the substrate and with very high accuracy and cleanliness. Therefore, the ion implantation may be utilized for manufacturing LSI elements, VLSI elements or the like, or synthesizing an alloy or an amorphous material.

Figure 1:
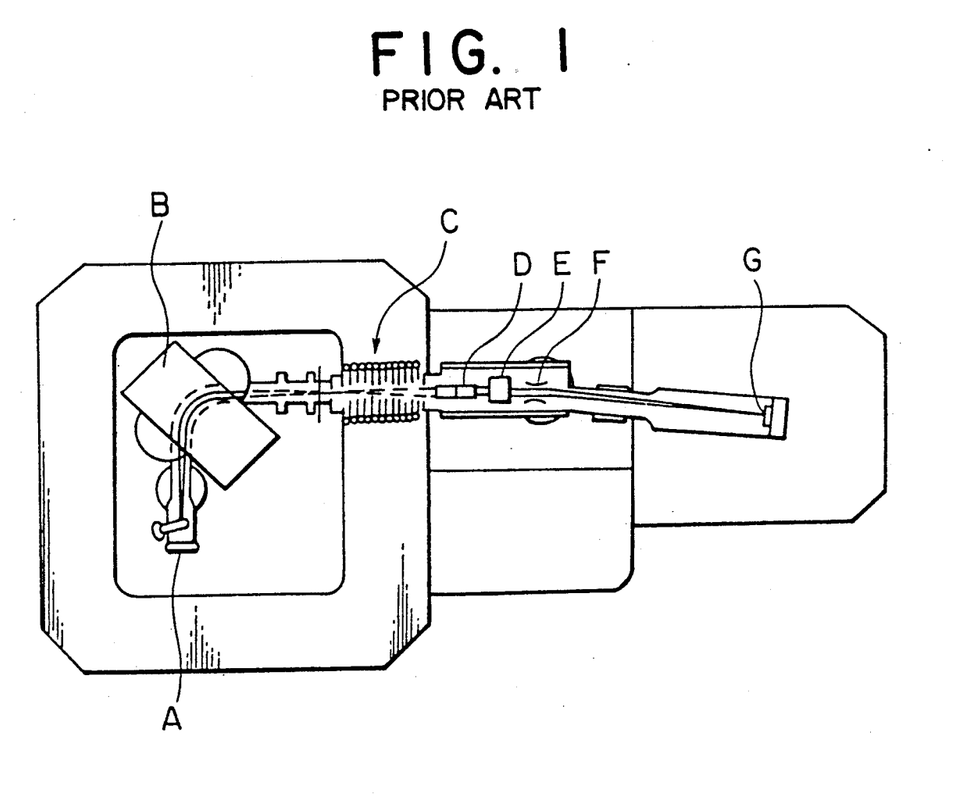
FIG. 1 is a schematic view of a conventional ion implantation apparatus.

An example of a conventional ion implantation apparatus is shown in FIG. 1 of the accompanying drawings. The apparatus shown in FIG. 1 comprises an ion source A for generating an ion beam, a mass separator B, an accelerator C, a converging lens system D, a parallel flat plate type electrostatic deflector E for deflecting the ion beam in Y direction (vertical direction), a parallel flat plate type electrostatic deflector F for deflecting the ion beam in X direction (horizontal direction), and a processing chamber which contains a substrate G to be ion implanted.

The ion beam generated by the ion source A is passed through the mass separator B by which ions having a predetermined kinetic energy and mass are selected from other ions produced in the ion source A. The ion beam containing ions selected by the mass separator B is accelerated by the accelerator C and then is converged by the converging lens system D.

In the parallel flat plate type electrostatic deflector E, the converged ion beam is swept in the Y direction by applying the voltage of a triangular wave form of for example 176 Hz, thereto. In the parallel flat plate type electrostatic deflector F, the ion beam is deflected by applying voltage for offsetting of approximately 7° in the X direction and simultaneously is swept in the X direction by applying voltage of a triangular waveform having, for example, 833 Hz.

With the conventional ion implanting apparatus, as mentioned above, after being swept in Y direction by means of the parallel flat plate type electrostatic deflector E, the ion beam is subjected to the offset-deflection in X direction and the sweeping-deflection in X direction simultaneously in the parallel flat plate type electrostatic deflector F. However, since the ion beam is raster-scanned in X and Y directions and thus the ion beam appearing on the output of the deflector F does not have a constant direction, and thus the ion beam is incident on the substrate G with different incidence angles from point to point.

If the diameter of the substrate is for example 6 inches, the difference of 2.7° in an implantation angle of incidence may occur between the ion beam incident on the periphery portion of the substrate and the ion beam incident on the center portion thereof. Also, with the substrate having a diameter of 8 inches, the difference in angle of incidence between the ion beam incident on the periphery portion and the ion beam incident on the center portion becomes 3.6°. Between the opposite edge portions of the 6-inch substrate there may occur the difference in angle of incidence 2.7°×2=5.4°. The 8-inch substrate 3.6°×2=7.2°.

This results in the ion implantation condition to be performed on the substrate or being different from point to point on the substrate or wafer. This phenomenon causes a shadowing effect in the ion implantation in fabricating IC elements trench constructions. Further, the uniformity of the ion implantation is deteriorated at the periphery portion of the substrate where the solid angle of the ion beam cut by the unit area of the substrate diminishes, also feasibly causing channeling at the periphery portion.

On the other hand, as the microfabrication of the substrate progresses and the pattern line width decreases, the shadowing effect in ion implantation has an unfavorable influence on the processing of the substrate. For a CMOS DRAM having 4M bits of memory or more, thus, it is necessary to ion implant the whole surface of the substrate with an ion beam pointed parallel to a definitely predetermined direction. More specifically, as the substrate size is increased from 6 to 8 inches and the memory size of the DRAMs increases to 4M or further 16M bits, and thus the pattern width is reduced, the need of parallel ion beam implantation has become to be closed-up.

It is, therefore, an object of the present invention is to overcome the problems involved in the conventional ion implantation apparatus.

Another object of the present invention is to provide an ion implantation apparatus which is capable of incidenting an ion beam all over a substrate at a constant incident angle without any deterioration of the characteristic thereof.

Another object of the present invention is to provide an ion implantation apparatus having a simplified deflector scanner system.

Another object of the present invention is to provide an ion implantater apparatus which is capable of providing a parallel scanning ion implantation of a substrate regardless of the size thereof.

A further object of the present invention is to eliminate any concentration of neutral particles produced from high energy ions by a charge exchange with atoms of residual gases at any local spot on the substrate which would seriously deteriorate the uniformity of the doping.

SUMMARY OF THE INVENTION

According to the present invention, there is provided an ion implantation apparatus comprising a first multipole electrostatic deflector disposed around an optical axis for offset deflecting an ion beam at a predetermined angle and for sweeping the ion beam simultaneously in X and Y directions, and a second multipole electrostatic deflector disposed around a second optical axis starting from the center of the first multipole electrostatic deflector and directed towards a line which makes the predetermined angle with the axis of the first multipole electrostatic deflector for sweeping and pointing the ion beam transmitted from the first multiple pole electrostatic deflector to a direction parallel with the second optical axis so as to have a constant angle at every spot with a substrate to be raster-scanned and ion-implanted.

The first multiple pole electrostatic deflector comprises five or more electrodes equally spaced around the first optical axis to each of which voltage for offset deflecting the ion beam at the predetermined angle and voltage for sweeping the ion beam in X and Y directions are applied in a superimposed state.

The second multiple pole electrostatic deflector comprises the same number of electrodes as the first deflector equally spaced around the second optical axis starting from the center of the first multipole electrostatic deflector and directed towards the line which makes the predetermined angle with the axis of the first multipole electrostatic deflector, to each of which voltages for sweeping the ion beam simultaneously in X and Y directions are applied so that the ion beam to be incident on a substrate always has a constant direction and angle with the surface of the substrate to be raster-scanned.

In the preferred embodiment of the present invention, each of the first and second multiple pole electrostatic deflectors is an octupole electrostatic deflector.

The ion beam is generated by an ion source and is fed into a mass separator by which only ions having the same mass number are selected. The ion beam containing ions thus selected is accelerated by an accelerator and converged by a converging lens.

In the ion implantation apparatus according to the present invention, the offset-deflecting voltage and the sweeping voltage may be in the superimposed state applied to each of the electrodes in the first multiple pole electrostatic deflector, and the sweeping voltage having a similar waveform to that of the multiple pole deflecting voltage and in phase therewith may be applied to the corresponding electrode of the second multiple pole electrostatic deflector. Therefore, the angle of incidence of the ion beam to be introduced into the substrate can be maintained at a constant to avoid any deterioration of the characteristic of the substrate.

The invention will now be described, by way of example, with reference to the accompanying drawings:

DETAILED DESCRIPTION

Figure 2:
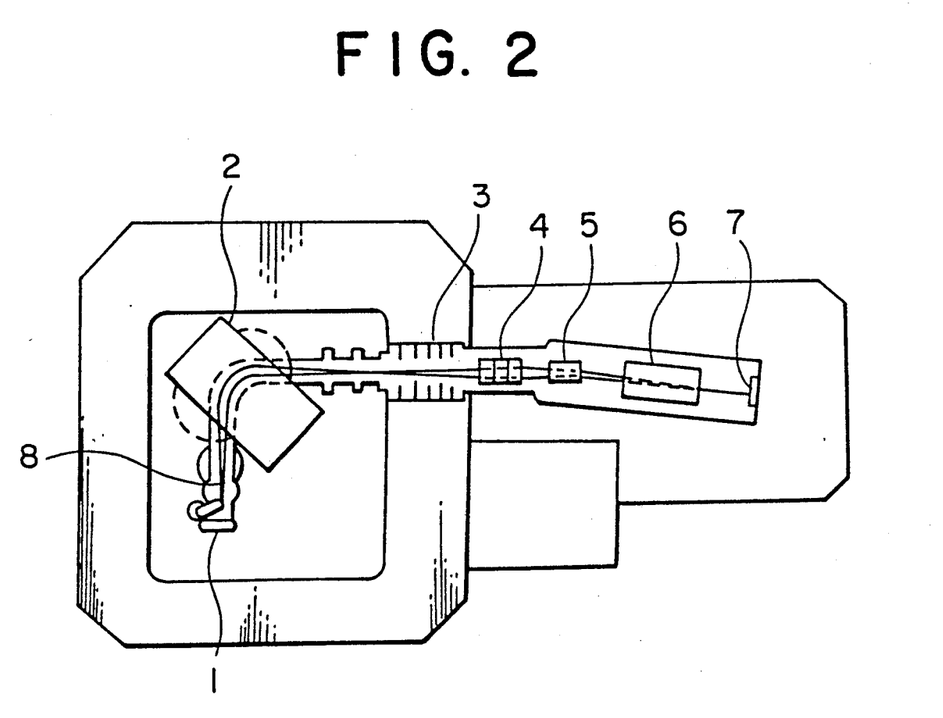
FIG. 2 is a schematic view showing an embodiment of the present invention.

With reference to FIG. 2 of the drawings there is shown whole construction of an ion implantation apparatus according to an embodiment of the present invention.

In FIG. 2, reference numeral 1 designates an ion source, reference numeral 2 designates a mass separator for separating only ions having the same mass number from other ions produced by the ion source 1, reference numeral 3 an accelerator for accelerating the ion beam including the separated ions having the same mass number, reference numeral 4 a converging lens for converging the ion beam accelerated by the accelerator 3, reference numeral 5 a first octupole electrostatic deflector for offset deflecting the ion beam converged by the converging lens 4 at a predetermined angle, for example, 7° and for sweeping the ion beam simultaneously in X direction (a horizontal direction) and Y direction (a vertical direction), and reference numeral 6 a second octupole electrostatic deflector which is disposed on the axis of the 7° offset-deflected ion beam at the rear of the first octupole electrostatic deflector 5 and which is larger in size than that of the first deflector 5. The second octupole electrostatic deflector 6 is intended to sweep the ion beam deflected by the first octupole electrostatic deflector 5 in X direction (a horizontal direction) and Y direction (a vertical direction) so that the ion beam which appears on the output of the second octupole deflector 6 constantly has a predetermined direction and angle with respect to a substrate 7 onto which the ion beam is to be implanted. The ion beam is generally designated by reference numeral 8.

Figure 3:
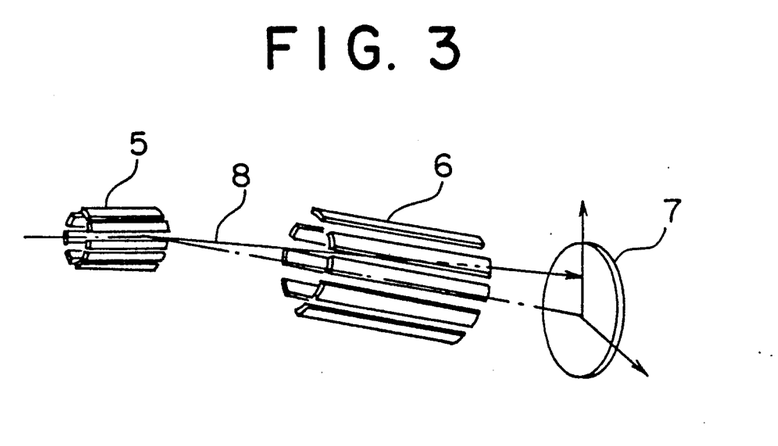
FIG. 3 is an enlarged perspective view showing essential components in the apparatus of FIG. 2.

As will be seen in FIG. 3, the first and second octupole electrostatic deflectors 5 and 6 comprise eight elongated electrodes, respectively.

Figure 4:
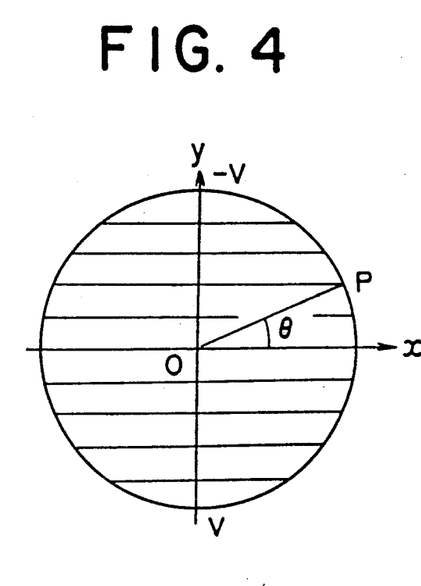
FIG. 4 is a diagrammatic explanatory view showing how the voltage is applied to a cylindrical electrostatic deflector.
Figure 5:
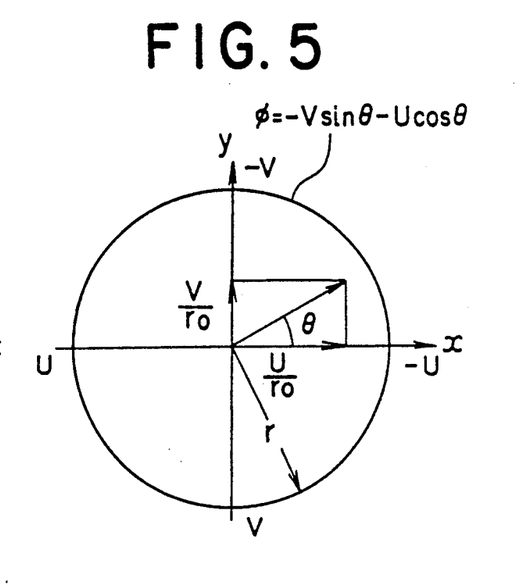
FIG. 5 is a diagrammatic explanatory view showing an electric field and voltages to be applied to the deflector.

With reference to FIGS. 4 and 5, the following describes how and what voltages are to be applied to the respective electrodes of the first and second deflectors. In FIGS. 3 and 4, it is assumed that a deflector has a cylindrical cross section to the periphery of which potentials are applied.

It will now be explained what voltages are to be applied to the periphery of the cylindrical section in order to generate a uniform electric field $V/r_o$ in a y-axis direction.

Considering the radius OP forming an angle $\theta$ with respect to the x-axis direction, the following relation may be provided.

$$\phi = -V/r_o \cdot r_o \sin\theta = -V \sin\theta$$

where $\phi$ is the potential on the point P. More specifically, when the potential as designated by $-V \sin\theta$ is applied to the periphery of the deflector, a uniform electric field $V/r_o$ may be formed in the y-axis direction in the cylindrical deflector. Similarly, when the potential $-U \cos\theta$ is applied to the periphery of the deflector, a uniform electric field $U/r_o$ may be formed in the x-axis direction in the cylindrical deflector.

Then, if the potential distribution such as $-V \sin\theta - U \cos\theta$ is applied to the periphery of the deflector as shown in FIG. 4, there may be obtained a uniform electric field E1 which consists of the superimposed y-axis direction field component $V/r_o$ and x-axis direction field component $U/r_o$.

Based upon the consideration mentioned above, it is possible to determine how and what voltages should be applied to the respective electrodes of the first and second octupole deflectors 5 and 6.

Figure 6:
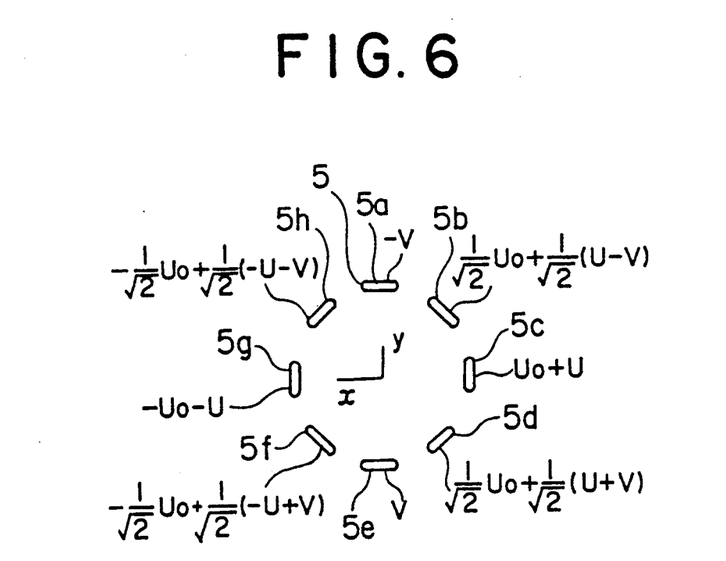
FIG. 6 is a schematic diagram showing how electrodes in the first multiple pole electrostatic deflector are arranged and voltages that are applied thereto.

As shown in FIG. 6, the first octupole electrostatic deflector 5 comprises eight electrodes 5a to 5h which are circularly arranged around an optical axis so that they are equally spaced from one another. Therefore, the voltages for offset-deflecting the ion beam 8 at the predetermined angle in the x-axis ($-U$) direction with respect to the optical axis, for example 7° may be so determined that 0 is applied to the electrode 5a, $1/\sqrt{2} \times U_O$ is applied to the electrode 5b, Uo to electrode 5c, $1/\sqrt{2} \times U_o$ to the electrode 5d, 0 to the electrode 5e, $-(1/\sqrt{2}) \times U_o$ to the electrode 5f, $-U_o$ to electrode 5g, and $-(1/\sqrt{2}) \times U_o$ to the electrode 5h.

The voltages for sweeping the ion beam 8 simultaneously in the x-axis direction or horizontal direction and y-axis direction or the vertical direction, may be so determined that $-V$ is applied to the electrode 5a, $(1/\sqrt{2}) \times (U-V)$ is applied to the electrode 5b, U to electrode 5c, $(1/\sqrt{2}) \times (U+V)$ to the electrode 5d, V to the electrode 5e, $(1/\sqrt{2}) \times (-U+V)$ to the electrode 5f, $-U$ to electrode 5g, and $(1/\sqrt{2}) \times (-U-V)$ to the electrode 5h. As shown in FIG. 6, these sweeping voltages are superimposed on the deflecting voltages, respectively.

Figure 7:
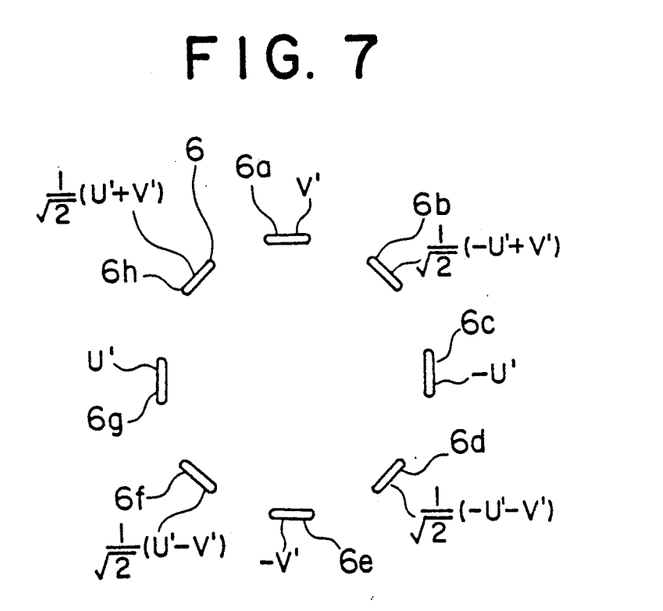
FIG. 7 is a schematic diagram showing how electrodes in the second multiple pole electrostatic deflector are arranged and voltages that are applied thereto.

Also, as will be seen in FIG. 7, the second octupole deflector 6 comprises eight electrodes 6a to 6h which are circularly arranged so that they are equally spaced from one another. The second octupole deflector 6 does not function to offset-deflect the ion beam 8, and is intended only to sweep the ion beam 8 simultaneously in the x'-axis direction or horizontal direction and y'-axis direction or the vertical direction with respect to the second optical axis starting from the center of the first octupole deflector 5 and directed towards the line which makes the predetermined angle with the axis of the first octupole deflector 5. The voltages to be applied to the respective electrodes 6a to 6h may be determined as illustrated in FIG. 7. That is, V' is applied to the electrode 6a, $(1/\sqrt{2}) \times (-U'+V')$ is applied to the electrode 6b, $-U'$ to electrode 6c, $(1/\sqrt{2}) \times (-U'-V')$ to the electrode 6d, $-V'$ to the electrode 6e, $(1/\sqrt{2}) \times (U'-V')$ to the electrode 6f, U' to electrode 6g, and $(1/\sqrt{2}) \times (U'+V')$ to the electrode 6h.

Uo is the voltage for offset-deflection and thus constant, and U, V, U' and V' are voltages for the x-axis direction and y-axis direction sweeping, and thus may be changed with time.

Figure 8:
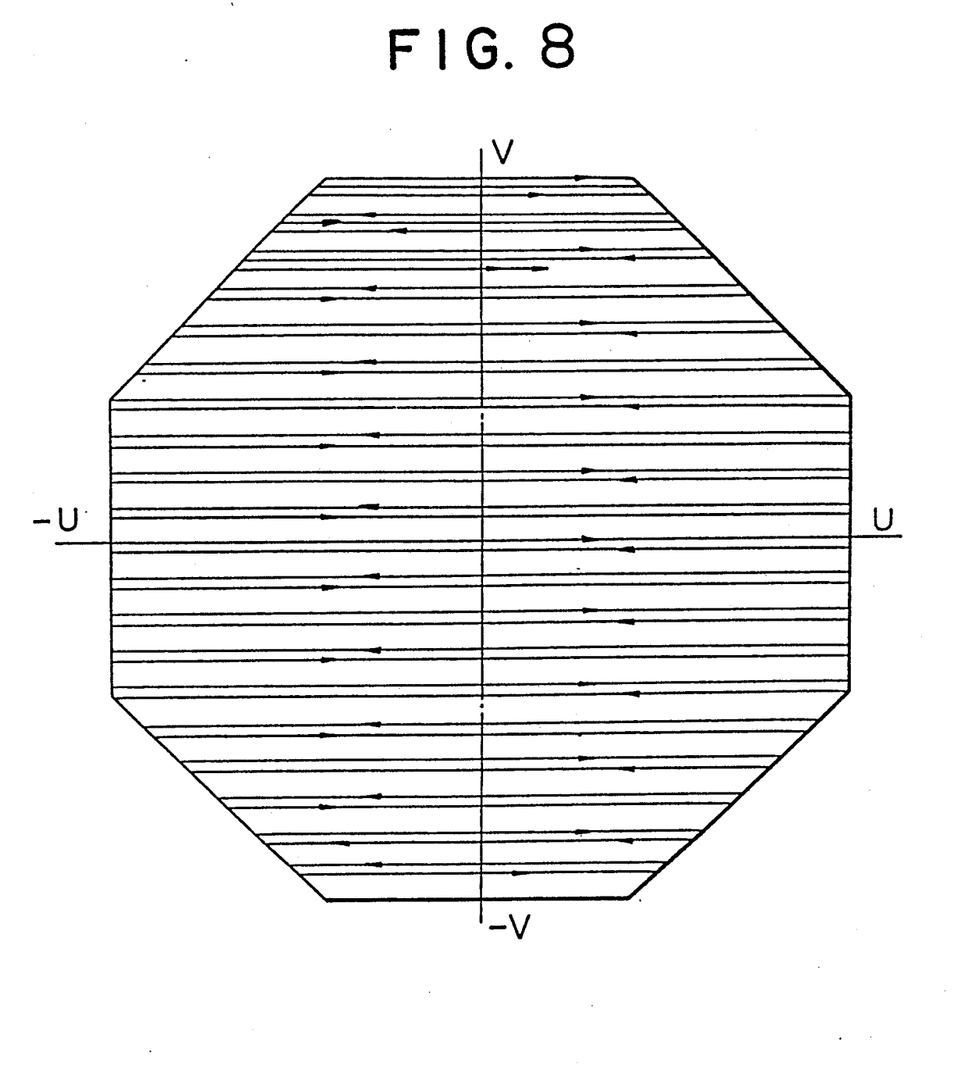
FIG. 8 is a diagrammatic explanatory view showing an example how the octagonal scanning region is scanned.

FIG. 8 shows a locus obtained when the substrate 7 was scanned by the ion beam 8 swept by the first and second octupole deflectors 5 and 6. A regular octagon circumscribed about the substrate is scanned in such a manner that the parallel ion beam scans downwards, upwards, downwards and so on, the full scanning region at a constant speed along parallel lines drawn with a definite interval thereon, and in such a way that the successive scan traces along parallel lines displaced from the said preceding lines by one quarter, one third or half of the interval.

The operation of the illustrated apparatus will now be described with reference to FIGS. 9, 10 and 11.

Figure 9:
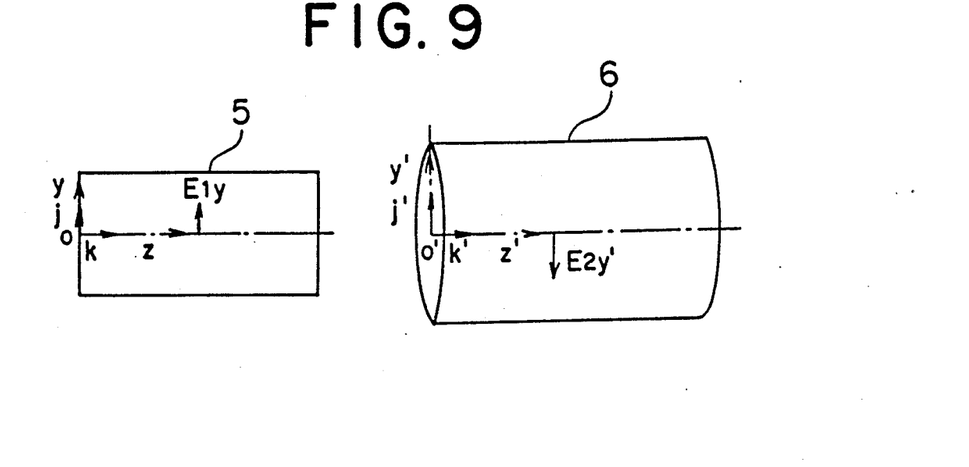
FIGS. 9 and 10 are explanatory views of a principle of the deflection on parallel sweeping in the first and second multiple pole electrostatic deflectors.
Figure 10:
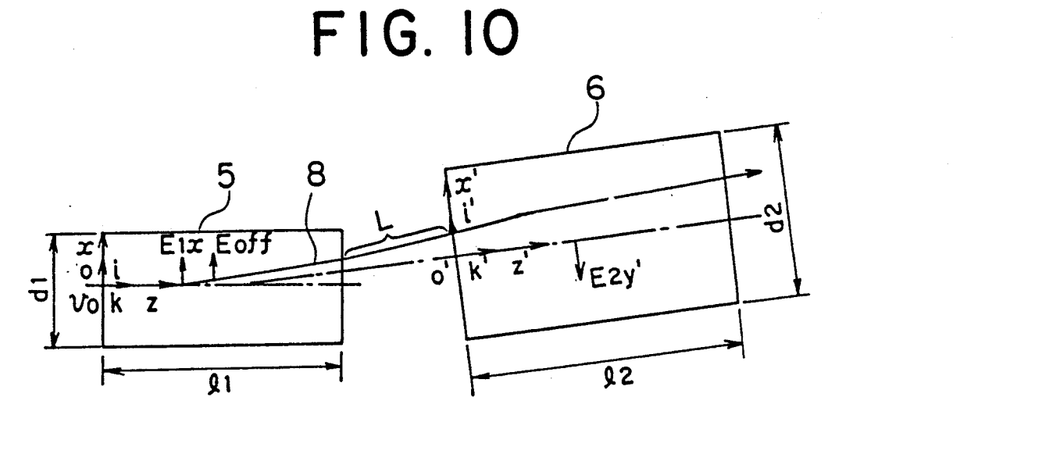

As shown in FIGS. 9 and 10, it is assumed that the first octupole electrostatic deflector 5 has a diameter d1 and a length l1, the second octupole electrostatic deflector 6 has a diameter d2 and a length l2, the distance along the orbit of the ion beam between the first and second deflectors 5 and 6 is designated by L, an electric field generated by the offset-deflecting voltage applied to the respective electrodes in the first deflector 5 is designated by $\vec{E_{off}}$, an electric field generated by the sweeping voltage in the first deflector 5 is designated by $\vec{E1}$, and an electric field generated by the sweeping voltage in the second deflector 6 is designated by $\vec{E2}$. Also, the direction of the center axis of the first octupole deflector 5 which is set to correspond to the direction of the ion beam entering into the first octupole deflector 5 is defined as z-axis, the direction of the electric field $\vec{E_{off}}$ for the offset-deflecting in the first deflector 5 is defined as x-axis, and y-axis is placed perpendicular to the z-axis and x-axis, thereby forming cartesian coordinates o - xyz. Similarly, the direction of the center axis of the second octupole deflector 6 which is set to correspond to the direction of the ion beam entering into the second octupole deflector 6 is defined as z'-axis, y'-axis is taken parallel with the y-axis, and x'-axis is placed perpendicular to the z'-axis and y'-axis, thereby forming cartesian coordinates o'-x'y'z'. The z'-axis corresponds to an axis starting from the center of the first deflector 5 and directed towards the line which makes the predetermined angle (7°) with the axis of the first deflector 5.

The electric field has a vector which influences the ion beam within the first octupole deflector 5, which is the sum of the vectors $\vec{E_{off}}$ and $\vec{E1}$. The sum of the vectors $\vec{E_{off}}$ and $\vec{E1}$ has a direction perpendicular to the z-axis because the vectors $\vec{E_{off}}$ and $\vec{E1}$ are perpendicular to the z-axis.

It is now assumed that the ions entered into the first octupole deflector 5 have an energy of uo eV, a velocity of vo m/s, a mass of m kg and an electric charge of e coulomb. Equations representing the motion of the ions within the first octupole deflector 5 with MKS system of units are as follows:

$$1/2 \, m \, v0^2 = e \, uo \quad (1)$$

$$m \, d^2x/dt^2 = e \, (Eoff + E1x) \quad (2)$$

$$m \, d^2y/dt^2 = e \, E1y \quad (3)$$

$$m \, d^2z/dt^2 = 0 \quad (4)$$

where E1x and E1y represent the x-component and y-component of E1, respectively.

Therefore, from the equation (4), there is obtained $dz/dt = a$ constant $= vo$. The time t1 which is required to pass the ions through the first octupole deflector 5 is represented by $l1/vo$.

Assuming that the velocity components in the x-direction and the y-direction of the ion beam on the output of the second octupole deflector 6 are designated by $(dx/dt)out$ and $(dy/dt)out$, respectively, by integrating the equations (2) and (3) with respect to the time "t" these velocity components may be represented as follows;

$$\begin{aligned}(dx/dt)\text{out} &= \int_0^{t1} (d^2x/dt^2) dt \\ &= e/m \, (Eoff + E1x) \, l1/vo\end{aligned} \quad (5)$$

-continued $$(dy/dt)_{out} = \int_0^{t1} (d^2y/dt^2)dt \quad (6)$$
$$= e/m \cdot Ely \cdot l1/vo$$

Then, if there is only the electric field $\overrightarrow{Eoff}$ for the offset-deflection within the first octupole deflector 5, the ion beam on the output of the first octupole deflector 5 has a velocity vector $\overrightarrow{voff}$ perpendicular to the z-axis which is represented by the following equation:

$$\overrightarrow{voff} = e/m \cdot \overrightarrow{Eoff} \cdot l1/vo \quad (7)$$

If there is only the electric field $\overrightarrow{E1}$ for the sweeping deflection within the first octupole deflector 5, the ion beam on the output of the first octupole deflector 5 has a velocity vector v1 perpendicular to the z-axis which is represented by the following equation:

$$\overrightarrow{v1} = e/m \cdot E1x \cdot l1/vo \cdot i + e/m \cdot E1y \cdot l1/vo \cdot j \quad (8)$$
$$= e/m \cdot l1/vo (E1x\, i + E1y \cdot j)$$
$$= e/m \cdot \overrightarrow{E1} \cdot l1/v0$$

where i and j are unit vectors in the directions of the x-axis and y-axis, respectively and the unit vector in the direction of the z-axis is represented by k in FIGS. 9 and 10.

Therefore, if there is the electric field $\overrightarrow{Eoff}$ for the offset-deflection and the electric field $\overrightarrow{E1}$ for the sweeping deflection within the first octupole deflector 5, the ion beam on the output of the first octupole deflector 5 has a velocity vector /e,rar/$\overrightarrow{v}$/ which is represented by the following equation:

$$\overrightarrow{v} = \overrightarrow{vo} + \overrightarrow{voff} + \overrightarrow{v1} \quad (9)$$

where $\overrightarrow{vo}$ is the velocity vector of the ion beam incident on the first octupole deflector 5.

Figure 11:
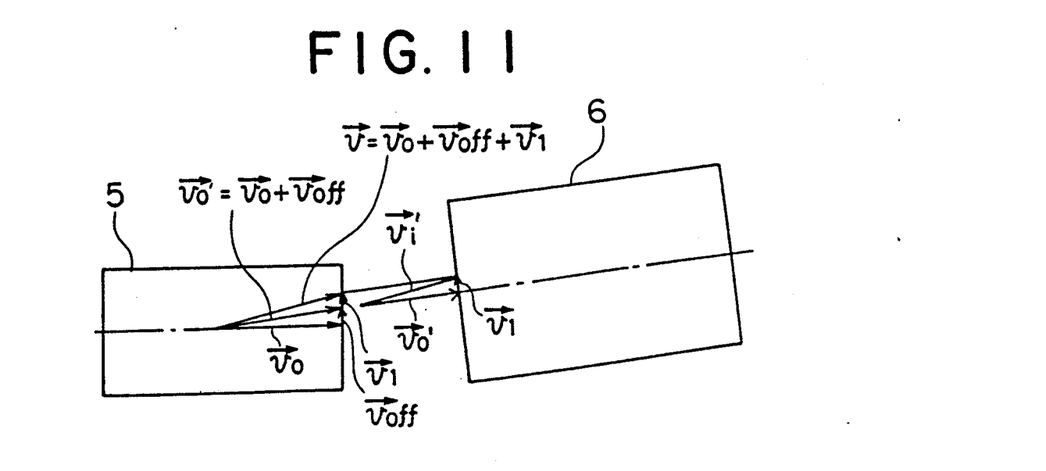
FIG. 11 is an explanatory view showing the velocity vectors of the ion beam on the output of the first multiple pole electrostatic deflector.

However, if only the electric field Eoff for offset deflecting the ion beam at 7° is applied to the first octupole deflector 5, as shown in FIG. 11, the velocity vector vo' of the ion beam on the output of the first octupole deflector is given by the following:

$$\overrightarrow{vo'} = \overrightarrow{vo} + \overrightarrow{voff} \quad (10)$$

Also, the magnitude of the velocity vector vo' is as follows:

$$vo' = vo/\cos 7° = 1.00751\, vo \quad (11)$$

Turning now to the second octupole deflector 6, since it has no influence of the electric field for the offset-deflection, the magnitude of the velocity vector vo' is equal to the above case, that is, vo' = 1.00751 vo. Therefore, the time $\Delta t2'$ which is required to pass the ions through the second octupole deflector 6 is represented by the following relation:

$$\Delta t2' = l2/vo' = l2/vo \cdot \cos 7° = l2/vo\ 0.9925 \quad (12)$$

To the second octupole deflector 6 is applied the x'-component $E2x'$ and the y'-component $E2y'$ of the electric field $\overrightarrow{E2}$ for sweeping the ion beam in such a manner that the following relations are satisfied.

$$E1x \cdot l1/vo = -E2x' \cdot l2/vo' \quad (13)$$

$$E1y \cdot l1/vo = -E2y' \cdot l2/vo' \quad (14)$$

That is, in FIGS. 4 and 5, if the electrodes of the first and second deflectors 5 and 6 are similar in configuration and spacing, but are different only in the length, the power supply may be constructed so that V' and U' are selected to be equal to V and U, respectively, the voltages V' and V, $-V'$ and $-V$, U' and U, $-U'$ and $-U$, $(1/\sqrt{2}) \times (U' + V')$, $(1/\sqrt{2}) \times (U + V)$ —are respectively supplied by a power source provided from the same signal source and amplifier having the same voltage gain, and the first octupole deflector 5 is supplied by a power source from which the offset voltages Uo, -Uo, $(1/\sqrt{2}) \times Uo$, and $-(1/\sqrt{2}) \times Uo$ are provided. Then, the conditions defined in the relations (13) and (14) may be satisfied if the length l2 of the second octupole deflector 6 can be selected so that the following equations are obtained.

$$|E1| = \lambda V/d1,\ |E2| = \lambda V/d2\ (\lambda = \text{a constant factor})$$
$$|E1|/|E2| = d2/d1$$
$$l2/d2 = l1/d1\ (vo'/vo) = 1.00751\ l1/d1$$

These conditions are realized when the sections of the first and second octupole are geometrically similar to each other, namely the cross sectional shape of each electrode of the second octupole deflector 6 and spacing between the adjacent electrodes are made with a constant magnification scale of the first octupole deflector 5, and only the length is a little elongated compared with the value of an exact proportion.

The ions within the second octupole deflector 6 may be represented by the following equations of motion with MKS system of units:

$$m\, d^2x'/dt^2 = e\, E2x' \quad (15)$$

$$m\, d^2y'/dt^2 = e\, E2y' \quad (16)$$

$$m\, d^2z'/dt^2 = 0 \quad (17)$$

When the ion beam, offset-deflected through the first octupole deflector 5, enters into the second octupole deflector 6, the ion beam has an incident velocity vector $\overrightarrow{v'}_{in}$ in given by the following relation:

$$\overrightarrow{v'}_{in} = \overrightarrow{vo} + \overrightarrow{voff} + \overrightarrow{v1} = \overrightarrow{vo'} + \overrightarrow{v1} \quad (18)$$

Since the component vo' is perpendicular to the x'-axis and y'-axis, the following relation may be obtained:

$$(dx'/dt)_{in} = (v1)_{x'}$$

The x-axis and x'-axis are in directions separated by 7°, and thus the following relation may be obtained:

$$(dx'/dt)_{in} = e/m \cdot E1x \cdot l1/vo \cdot \cos 7° \quad (19)$$

Further, since the y-axis and y'-axis are placed parallel to each other, the following relations may be obtained:

$$(dy'/dt)_{in} = (v1)_{y'} = (v1)_y = e/m \cdot E1y \cdot l1/vo \quad (20)$$

$$(dz'/dt)_{in} = |vo'| + (v1 \cdot k') \quad (21)$$
$$= |vo'| + e/m \cdot E1x \cdot l1/vo \cdot \sin 7°$$

where (v1·k') is a scalar product of the velocity vector v1 and the unit vector k' in the direction of the z'-axis.

The velocity components of the ion beam at the output of the second octupole deflector 6 may be obtained by integrating the relations (15), (16) and (17) with respect to the time t. That is, $$(dx'/dt)_{out} = e/m \cdot E1x \cdot l1/vo \cdot \cos 7° +$$
$$e/m \cdot E2x' \cdot l2/vo'$$

From the relation (13), the following relations may be obtained:

$$(dx'/dt)_{out} = e/m \cdot E1x \cdot l1/vo (\cos 7° - 1) \quad (22)$$
$$= e/m \cdot E1x \cdot l1/vo (-0.007453)$$
$$= v1x (-0.007453)$$

$$(dy'/dt)_{out} = e/m \cdot E1y \cdot l1/vo + e/m \cdot E2y' \cdot \quad (23)$$
$$l2/vo' = 0$$

$$(dz'/dt)_{in} = |vo'| + |e/m \cdot E1x \cdot l1/vo| \cdot \sin 7° \quad (24)$$
$$= |vo'| + v1x \cdot 0.1218$$

Then, the following are the actual numeric values which may be calculated in the case that the illustrated apparatus is utilized to implant the ions onto a 6-inch wafer.

If the first octupole deflector is 10 cm in diameter and its length 36 cm, $E1x_{max}=12.5KV/10$ cm, E1y=0, and uo=200 eV, there is obtained v1x/vo=0.1125, and the angle '2 which is between the ion beam at the of the second octupole deflector 6 and z'-axis becomes as follows:

$$\tan \theta 2 = (dx'/dt)/(dz'/dt)$$
$$= (-v1x \cdot 0.007453)/(1.00751vo + v1x \cdot 0.1218)$$
$$= (-0.1125 \times 0.007453)/(1.00751 + 0.1125 \times 0.1218)$$
$$= -0.000821$$

$$\theta 2 = -0.047°$$

In the above case, $|E1|_{max}=12.5KV/10$ cm is sufficient for raster scanning over the substrate with a margin of about 3 cm around it. The maximum deviation from exact parallelism of the incident ion beam is −0.047° when the beam is deflected to the left or right side, while the beam is deflected to the upper and lower directions there is no deviation from the exact parallelism even at the edge of a raster pattern, and the deviation from the exact parallelism is less than 0.047° at any point over the substrate.

It is, therefore, appreciated that a parallel ion beam having an error less than 0.05° can be obtained at the output of the second octupole deflector 6.

In the illustrated embodiments described above, octupole electrostatic deflectors are employed. It should, however, be understood that the number of the electrodes of each electrostatic deflector may be five or more and thus it is possible to use multiple pole electrostatic deflectors which comprise poles less than or more than eight poles.

Further, the ion beam may be swept on the substrate so that it draws a circular or polygonal locus.

According to the ion implantation apparatus of the present invention, as described above, since the first octupole deflector is arranged to offset deflect the ion beam at the predetermined angle and to sweep simultaneously in the x and Y directions, and the second multiple pole electrostatic deflector is disposed around the axis of the deflected and swept ion beam from the first octupole deflector for sweeping the ion beam simultaneously in the x and Y directions so that the ion beam always has a constant angle and direction with respect to the substrate to be ion implanted, the ion beam can be implanted onto the substrate with a constant incident angle all over the regions thereof, thereby avoiding any deterioration of the characteristic of the ion-implanted substrate.

Figure 12:
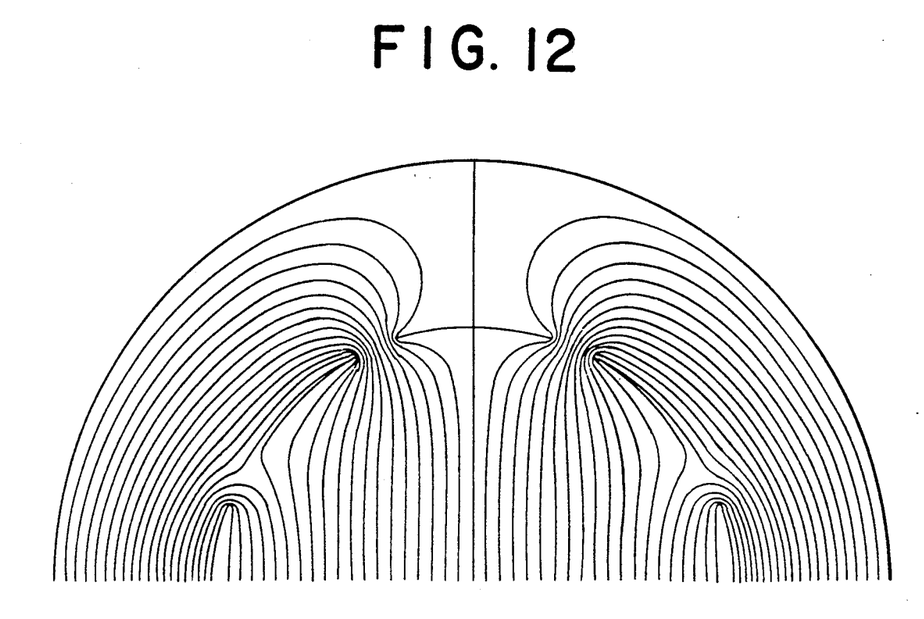
FIGS. 12 to 14 are computer generated schematic diagrams showing equipotential lines inside the cross section of an octupole electrostatic deflector obtained by a computer simulation for different deflection directions.
Figure 13:
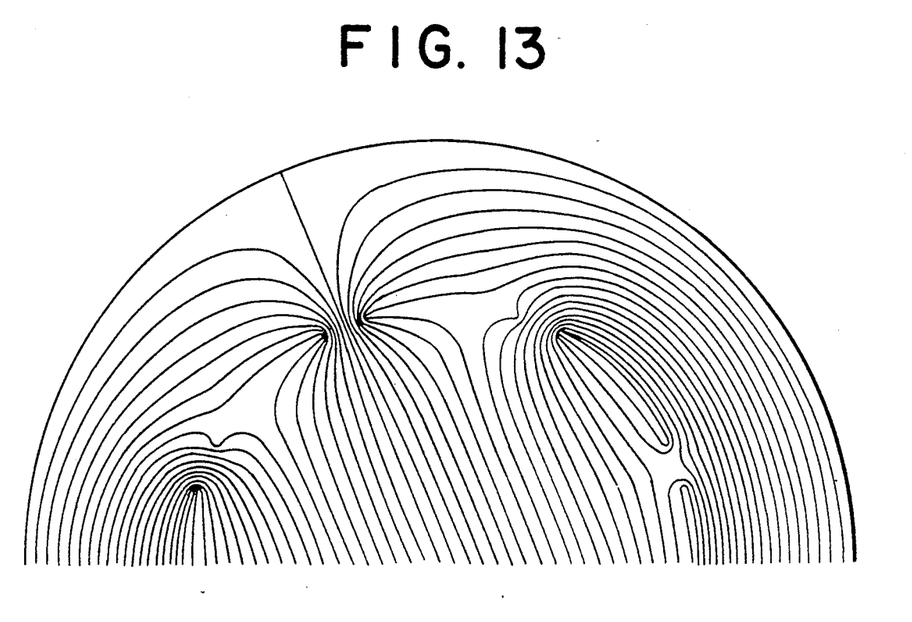
Figure 14:
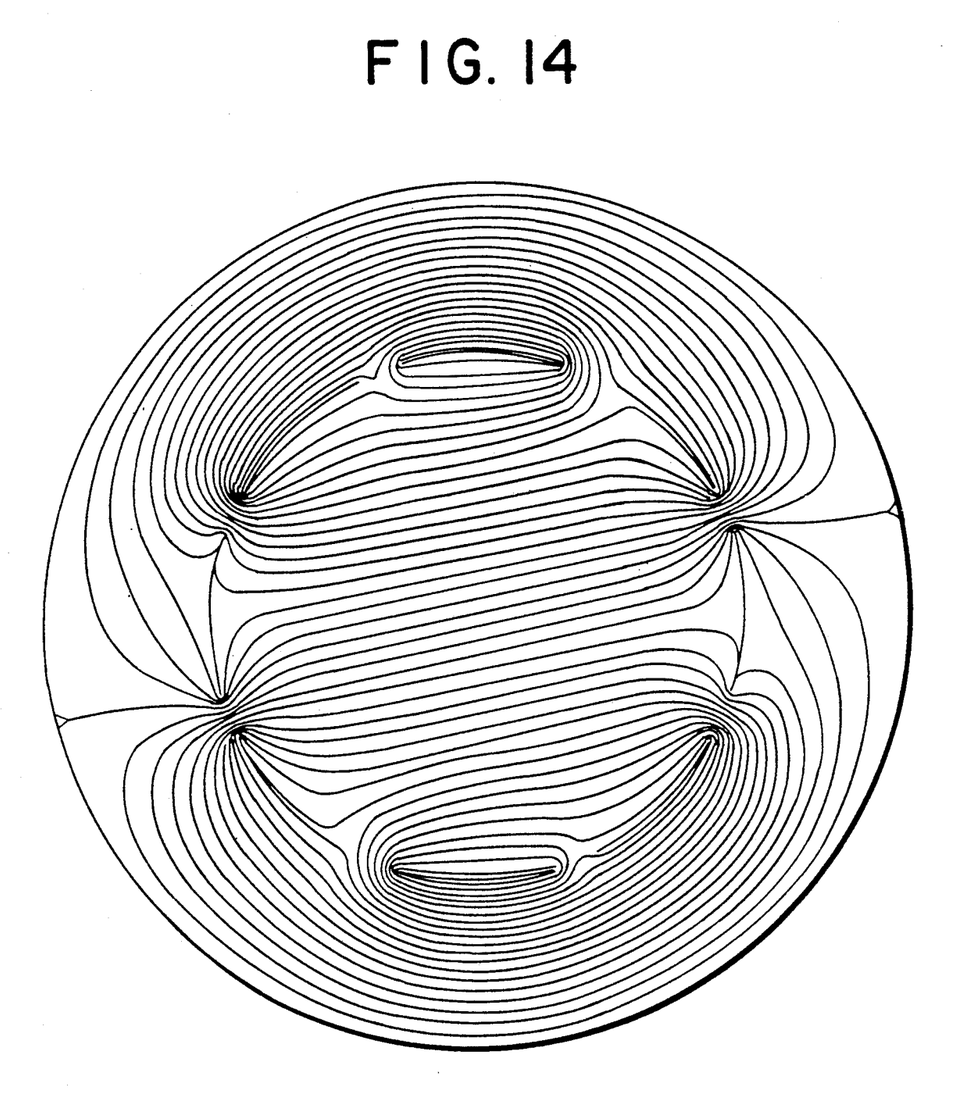

Further, with the provision of the multiple pole electrostatic deflectors, the effective range of the uniform electric field for sweeping can be widened as compared with the case of the conventional parallel flat plate electrostatic deflector, thereby reducing the size of the scanner to the realizable size, so that the parallel beam ion implanter for 8 inch wafers has been designed with the overall length of 6.5 meters, while with a conventional parallel plate type ion implanter, the length of the apparatus for producing a parallel beam would surpass 10 meters. In FIGS. 12 to 14 the distribution of the equipotential lines inside the cross section of the octupole electrostatic deflector are shown for different deflection directions which are obtained by a computer simulation. FIG. 12 shows the equipotential lines when the deflection is made in a direction of 25° with respect to the center axis of the deflector. FIG. 13 shows the equipotential lines with the deflection of 22.5°. FIG. 14 shows the equipotential lines with the deflection of 11.25°. In each case the result shows that a uniform electric field may be produced in the area of about 70% of the diameter.

The previously mentioned constant factor λ is explained as follows:

FIG. 12, FIG. 13 and FIG. 14 show equipotential lines by computer simulation inside octupole electrostatic deflectors. In this case the octupole deflector is composed of eight electrodes with arc shaped cross sections set symmetrically around the circle with diameter $d_o$, as shown in FIG. 3. The central angle of the arc is 35° in this case.

In FIG. 12, FIG. 13 and FIG. 14 the voltages are applied to the electrodes as follows.

In FIG. 5, the potential distribution around the periphery is given as:

$$\phi = -V_o(\sin \theta_o \sin \theta + \cos \theta_o \cos \theta) \quad (25)$$

Then, $|\phi|$ is maximum at $\theta=\theta_o$ and $\theta=\theta_o+\pi$, and equal to $V_o$. Thus it is clear that the angle between the vector of the electric field inside the cylinder and the x-axis is equal to $\theta_o$. The voltages given to the electrodes of the octupole are $-V=-V_o \sin \theta_o$, $-1/\sqrt{2} \cdot (-V+U) = -1/\sqrt{2} \cdot (V_o \sin \theta_o + V_o \cos \theta_o)$, $-U=V_o \cos \theta_o$, and so on.

The electric field in the central portion of the cylinder is the same in its absolute value. This relation is shown in FIG. 12, FIG. 13, and FIG. 14, where the spacings between adjacent equipotential lines with equal potential difference are the same in spite of the difference of the direction of the electric field in the three cases.

FIG. 12 shows that the equipotential lines are parallel and the spacings between them are equal inside the concentric circle which has a diameter of 70% of the diameter $d_o$ of the deflector. The spacing between adjacent equipotential lines is $0.02586 d_o$, and the potential difference between the adjacent equipotential lines is $1/20 \cdot V_o$ (as the potential difference between $V_o$ and $-V_o$ is divided by 40 equipotential lines).

Thus the field magnitude is calculated as:

$$E = 1.9334 V_o / d_o \qquad (26)$$

Referring to FIG. 13 and FIG. 14 and the above explanation, the magnitude of the electric field is also equal to the value given above in (26) in spite of the difference of the direction of the field.

When the first octupole and second octupole are geometrically similar, for instance, each of them is made of eight poles of arc shaped cross section with the central angle of the arc of 35°, the magnitude of the field inside the concentric circle which has the diameter of 70% of each deflector, is:

$$E_1 = 1.9334 \, V_1 d_1$$

$$E_2 = 1.9334 \, V_2 d_2$$

Similarly, in the general case where the first and the second octupoles are geometrically similar, the formulae $E_1 = \lambda V_1 / D_1$ and $E_2 = \lambda V_2 / D_2$ result and can be used.

Moreover, the electric capacitance between the electrode of the mulipole electrostatic deflector and the wall of a vaccum chamber is extremely small, for instance about 10pF, even for the second octupole deflector of scanner for 8 inch wafers since the width of each electrode is narrow in the multipole electrostatic deflectors. while in the case of the parallel plate type scanner the electric capacitance of the electrode would surpass 150pF. The blunting and phase shift of the triangular waveform voltage depends on the quantity of FCR where F is the frequency of the triangular waves, C is the electric capacitance and R is the output impedance of a negative feedback high voltage power amplifier. It is only possible to manufacture the high speed, high precision and high voltage power amplifier for a capacitive load less than 100pF by the present technology.

By offset-deflecting the ion beam by 7° simultaneously with the raster scanning deflection, it is possible to eliminate any concentration of neutral particles produced from high energy ions by a charge exchange with atoms of residual gases at any local spot on the substrate which would seriously deteriorate the uniformity of the doping.

The terms and expressions which have been employed herein are used as terms of description and not of limitation, and there is no intention, in the use of such terms and expressions, of excluding any equivalents of the features shown and described but it is recognized that various modifications are possible within the scope of the invention claimed.

What is claimed is:

1. An ion implantation apparatus comprising a first multipole electrostatic deflector disposed around an optical axis for offset-deflecting an ion beam at a predetermined angle and for simultaneously sweeping the ion beam in x and Y directions, and a second multipole electrostatic deflector disposed around a second optical axis starting from the center of said first multipole electrostatic deflector and directed towards a line which makes said predetermined angle with the axis of said first multipole electrostatic deflector for sweeping and pointing the ion beam transmitted from the first multiple pole electrostatic deflector to a direction parallel with the second optical axis so as to have a constant angle at every spot with a substrate to be raster-scanned and ion-implanted.

2. An ion implantation apparatus as claimed in claim 1, wherein said first multipole electrostatic deflector comprises five or more electrodes equally spaced around the first optical axis to each of which voltage for deflecting the ion beam at the predetermined angle and voltage for sweeping the ion beam simultaneously in x and Y directions are applied in a superimposed state, and said second multipole electrostatic deflector comprises the same number of electrodes as the first deflector equally spaced around the second optical axis, to each of which voltage for sweeping the ion beam in X and Y directions are applied so that the ion beam to be incident on a substrate always has a contant direction and angle with respect to the substrate.

3. An ion implantation apparatus as claimed in claim 1, wherein each of said first and second multipole electrostatic deflectors is an octupole electrostatic deflector.

4. An ion implantation apparatus as claimed in any one of claims 1 to 3, wherein the sweeping voltages to be applied to the electrodes of said first and second multipole electrostatic deflectors are supplied by common sweeping voltages.

5. An ion implantation apparatus as claimed in any one of claims 1 to 3, wherein the sweeping voltages to be applied to the electrodes of said first and second multipole electrostatic deflectors are supplied by superimposing the sweeping voltages on the offset deflection voltages by coupling capacitors for the first multipole electrostatic deflector, and by feeding the same sweeping voltages directly to the electrodes of the second multipole electrostatic deflector.

6. An ion implantation apparatus as claimed in any one of claims 1 to 3, wherein the sweeping voltages to be applied to the electrodes of said first multipole electrostatic deflector are supplied by adding the sweeping signal voltages to the offset deflection signal voltages and amplifying the synthesized signal voltages with the same voltage gain, and the sweeping voltages to be applied to the electrodes of said second multipole electrostatic deflector are supplied by amplifying the the same sweeping signal voltages with the same voltage gain.

* * * * *